United States Patent [19]
Kragl et al.

[11] Patent Number: 5,475,775
[45] Date of Patent: Dec. 12, 1995

[54] METHOD FOR PRODUCING A HYBRID INTEGRATED OPTICAL CIRCUIT AND DEVICE FOR EMITTING LIGHT WAVES

[75] Inventors: Hans Kragl, Ober-Ramstadt; Wolf-Henning Rech, Griesheim, both of Germany

[73] Assignee: Robert Bosch GmbH, Stuttgart, Germany

[21] Appl. No.: 295,915

[22] PCT Filed: Dec. 4, 1993

[86] PCT No.: PCT/DE93/01155

§ 371 Date: Sep. 13, 1994

§ 102(e) Date: Sep. 13, 1994

[87] PCT Pub. No.: WO94/16348

PCT Pub. Date: Jul. 21, 1994

[30] Foreign Application Priority Data

Jan. 13, 1993 [DE] Germany ............................ 43 00 652.3

[51] Int. Cl.$^6$ .............................. G02B 6/12; B29D 11/00; H01L 21/70
[52] U.S. Cl. .................... 385/14; 385/31; 385/39; 385/49; 385/88; 385/92; 385/94; 264/1.24; 264/1.25; 437/51; 437/211; 437/219
[58] Field of Search ................... 385/14, 15, 31, 385/39, 49, 51, 52, 88, 89, 92, 94, 131, 132; 264/1.1, 1.24, 1.25, 2.7; 437/51, 209, 211, 219

[56] References Cited

U.S. PATENT DOCUMENTS

| 4,735,677 | 4/1988 | Kawachi et al. ............ 156/633 |
| 4,750,799 | 6/1988 | Kawachi et al. ............ 385/14 X |
| 5,030,321 | 7/1991 | Coutandin et al. ............ 156/643 |
| 5,035,483 | 7/1991 | Waitl et al. ............ 385/14 |
| 5,123,066 | 6/1992 | Acarlar ............ 385/14 |
| 5,179,609 | 1/1993 | Blonder et al. ............ 385/89 |
| 5,230,990 | 7/1993 | Iwasaki et al. ............ 430/321 |
| 5,262,656 | 11/1993 | Blondeau et al. ............ 257/80 |
| 5,307,435 | 4/1994 | Chihara ............ 385/92 |
| 5,319,725 | 6/1994 | Buchmann et al. ............ 385/14 |
| 5,343,544 | 8/1994 | Boyd et al. ............ 385/46 |
| 5,359,687 | 10/1994 | McFarland et al. ............ 385/49 |
| 5,367,593 | 11/1994 | Lebby et al. ............ 385/53 |

FOREIGN PATENT DOCUMENTS

| 313956 | 5/1989 | European Pat. Off. ............ 385/14 X |
| 331338 | 9/1989 | European Pat. Off. ............ 385/14 X |
| 495559 | 7/1992 | European Pat. Off. ............ 372/43 X |

OTHER PUBLICATIONS

K. Jackson et al., "Flip–Chip, Self–Aligned, Optoelectronic Transceiver Module", ECOC '92, Berlin, vol. 1, 27 Sep. 1992, pp. 329–332.

M. Hamacher et al., "A Novel Fibre/Chip Coupling Technique with an Integrated Strain Relief on InP", ECOC '92, Berlin, vol. 1, 27 Sep. 1992, pp. 537–540.

(List continued on next page.)

*Primary Examiner*—Brian Healy
*Attorney, Agent, or Firm*—Kenyon & Kenyon

[57] ABSTRACT

A method for producing a hybrid integrated optical circuit which utilizes a molding tool having holding devices for an electrooptic semiconductor component, negative molds for a waveguide trench and holding devices for an optical waveguide. The holding devices of the molding tool adjust the electrooptic semiconductor component with respect to the negative mold of the waveguide trench during reshaping with a polymer. The basic unit produced consists of the electrooptic semiconductor component, which is adjusted with respect to the waveguide trench molded in the polymer. Adjoining the waveguide trench are holding devices, which are molded in the polymer and by means of which an optical waveguide can be coupled to the waveguide trench in a self-adjusting fashion. The basic unit and the optical waveguide are permanently connected to one another with the aid of a cover, the waveguide trench being filled with an optically transparent material, as a result of which a waveguide is formed.

23 Claims, 3 Drawing Sheets

OTHER PUBLICATIONS

Z. Weissman et al., "2–D Mode Tapering Via Tapered Channel Waveguide Segmentation", *Electronics Letters*, vol. 28, No. 16, 30 Jul. 1992, pp. 1514–1516.

Japanese Patent Application 59 121 008, *Patent Abstracts of Japan*, vol. 008, No. 248, Nov. 14, 1984.

Japanese Patent Application 02 131 202, *Patent Abstracts of Japan*, vol. 14, No. 358, Aug. 2, 1990.

T. Koch et al., "Tapered Waveguide InGaAs/InGaAsP Multiple–Quantum–Well Lasers", *IEEE Photonics Technology Letters*, vol. 2, No. 2, Feb. 1990, pp. 88–90.

M. Yanagisawa et al., "Film–Level Hybrid Integration of AlGaAs Laser Diode with Glass Waveguide on Si Substrate", *IEEE Photonics Technology Letters*, vol. 4, No. 1, Jan. 1992, pp. 21–23.

W. Chan et al., "Channel Glass Waveguide Detectors with Grafted GaAs Film in Embedded Configuration", *Electronics Letters*, vol. 27, No. 5, 28 Feb. 1991, pp. 410–412.

W. Chan et al., "Optical Coupling of GaAs Photodetectors Integrated with Lithium Niobate Waveguides", *IEEE Photonics Technology Letters*, vol. 2, No. 3, Mar. 1990, pp. 194–196.

A. Yi–Yan et al., "Grafted InGaAsP Light Emitting Diodes on Glass Channel Waveguides", *Electronics Letters*, vol. 28, No. 4, 13 Feb. 1992, pp. 341–342.

R. Zengerle et al., "Investigations of Low Loss Fibre–Chip Coupling by Buried Laterally Tapered InP/InGaAsP Waveguide Structures", ECOC '92, Berlin, 27 Sep. 1992, pp. 545–547.

C. A. Armiento et al., "Passive Coupling of InGaAsP/InP Laser Array and Singlemode Fibres Using Silicon Waferboard", *Electronics Letters*, vol. 27, No. 12, 6 Jun. 1991, pp. 1109–1111.

Fig. 2a
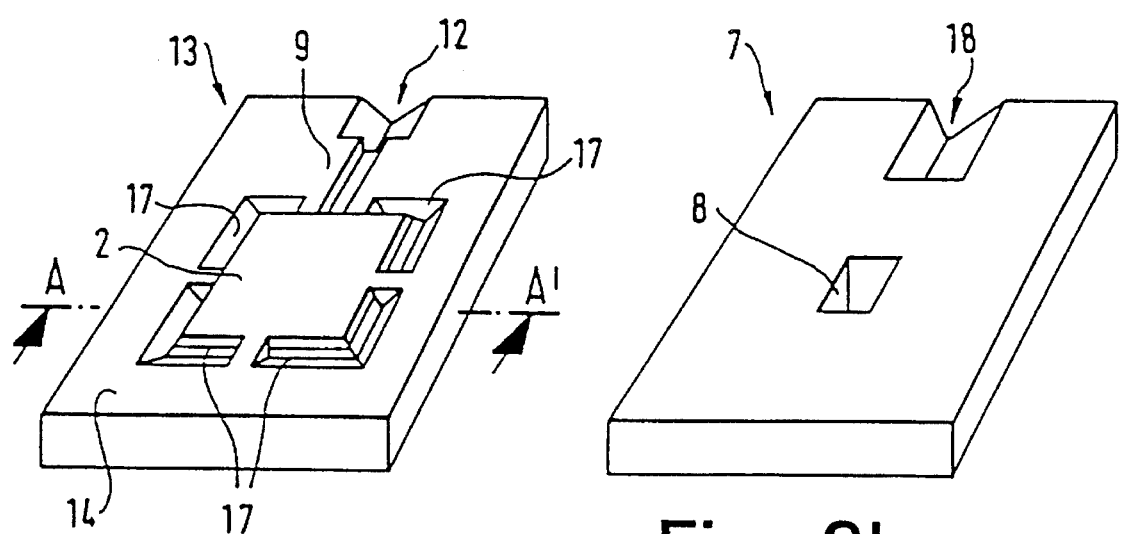
Fig. 2b
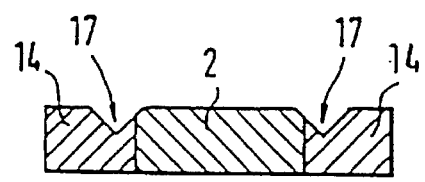
Fig. 2c

METHOD FOR PRODUCING A HYBRID INTEGRATED OPTICAL CIRCUIT AND DEVICE FOR EMITTING LIGHT WAVES

FIELD OF THE INVENTION

The present invention relates to a method for producing a hybrid integrated optical circuit.

BACKGROUND OF THE INVENTION

A method is already known in which a glass fiber is coupled to a waveguide which has been inserted into an indium phosphide chip. In order to be able to couple the glass fiber in an adjusted state to the waveguide prepared for coupling, it is necessary to etch a V-shaped trench into the indium phosphide chip. Furthermore, the adjustment of the glass fiber must be done manually under a microscope so that the coupling losses occurring due to defective adjustment are kept as low as possible. (M. Hamacher, A novel fibre/chip coupling technique with an integrated strain relief on InP, ECOC 92, Berlin, pages 537 ff.) This method is time-consuming and expensive and cannot be applied to mass production.

Furthermore, a method is known in which a laser chip is adjusted on an integrated optical circuit with respect to waveguides with the aid of spacers and adjusting devices. However, this method requires the laser chip to be structured by means of etching operations for the purpose of holding the spacers and the adjusting devices. Furthermore, the spacers and the boundaries must be applied to the integrated optical circuit. This is very expensive however, since the spacers and the adjusting devices have to be produced and positioned with high accuracy. In addition, the laser chip must be inserted manually into the adjusting devices. (Jackson, Flip/Chip, Self-Aligned, Optoelectronic Transceiver Module, ECOC 92, Berlin, pages 329 ff.).

SUMMARY OF THE INVENTION

The method according to the present invention has the advantage that the adjustment of the electrooptic semiconductor component to the waveguide and the adjustment of the waveguide to the optical waveguide is performed without additional outlay when molding the basic unit, which consists of the electrooptic semiconductor component and the molded polymer. A time-consuming manual adjustment is thereby avoided.

The production of differently constructed integrated optical circuits is possible by using a molding tool which can be produced galvanically in many shapes simply and cost-effectively. The simple molding operation, in which the electrooptic semiconductor component is coupled in a self-adjusting fashion to the waveguide trench, is suitable for automated mass production. Integrated optical circuits can thereby be produced cost-effectively.

It is particularly advantageous that the side walls of the holding devices of the molding tool according to the present invention, which bound the space for the electrooptic semiconductor component to be accommodated, and the side walls of the electrooptic semiconductor component extend inwards in a beveled fashion. As a result, the sides of the holding device and those of the electrooptic semiconductor component slide against one another during the insertion of the electrooptic semiconductor component. The area for holding the electrooptic semiconductor component decreases continuously with decreasing distance from the molding tool, as a result of which the insertion of the electrooptic semiconductor component into the holding devices is simplified and a self-adjustment of the electrooptic semiconductor component is performed during insertion. As a result, electrooptic semiconductor components having a relatively large tolerance in the dimensions can be coupled to the waveguide trench with a minimum adjustment error.

It is particularly advantageous for the basic unit and an optical waveguide according to the present invention to be permanently connected to one another with the aid of a cover, preferably made from polymer, the waveguide trench being filled with an optically conductive, relatively high-index material, preferably with polymer. The cover has self-adjusting holding devices for the adjustment of the optical waveguide. A waveguide is produced in this way accompanied by filling the waveguide trench with a polymer. At the same time, the polymer is used to connect the cover to the basic unit. The self-adjusting holding devices of the cover simplify the adjustment of the optical waveguide with respect to the waveguide trench. They are, moreover, advantageous whenever the cover contains elements which influence or detect the optical field.

Openings are provided or produced subsequently by means of laser ablation in the cover for particularly simple electrical contacting of the electrooptic semiconductor component. Contacts for high currents can be attached in this way to the electrooptic semiconductor component. Alternatively, conductor tracks are sputtered or vapor deposited onto the polymer surface for electrical contacting of the electrooptic semiconductor component.

These types of electrical contacting are technically easy to master, cost-effective and compatible with many production methods.

An extension of the method according to the present invention consists in preferably making use as electrooptical semiconductor component of laser diodes, laser diode arrays, laser diode amplifiers, laser diode amplifier arrays, semiconductor modulators, semiconductor demodulator arrays, detectors and detector arrays. As a result, differently constructed integrated optical circuits can be produced using the same method.

Another extension of the method according to the present invention consists in attaching a thermoelectric component in the region of the electrooptic semiconductor component in such a way that the refractive index of the waveguide can be varied.

It is particularly advantageous to construct the waveguide as a lateral continuous and/or segmented taper. It is therefore possible in the method for producing the basic unit simultaneously to construct a taper which expands the light spot emitted by the electrooptic semiconductor component, and thus reduce the coupling losses on the optical waveguide. The construction of the waveguide as a laterally continuous and/or segmented taper can be carried out economically with the aid of the molding operation in a simple way and without a further machining process.

An improvement of the method according to the present invention consists in coupling the carrier plate to a heat sink, preferably a Peltier element. The heat generated by the electrooptic semiconductor component is dissipated therewith.

It is advantageous for a compact integration of a hybrid integrated optical circuit when the heat sink is configured as a silicon plate to which electronic circuit arrangements are applied. The result is a higher integration and a reduction in the dimensions of the overall component.

BRIEF DESCRIPTION OF THE DRAWINGS

FIG. 2A shows a basic unit in accordance with the present invention.

FIG. 2B shows a cross section of a basic unit in accordance with the present invention.

FIG. 2C shows a cover plate in accordance with the present invention.

DETAILED DESCRIPTION OF THE INVENTION

Figure 1:
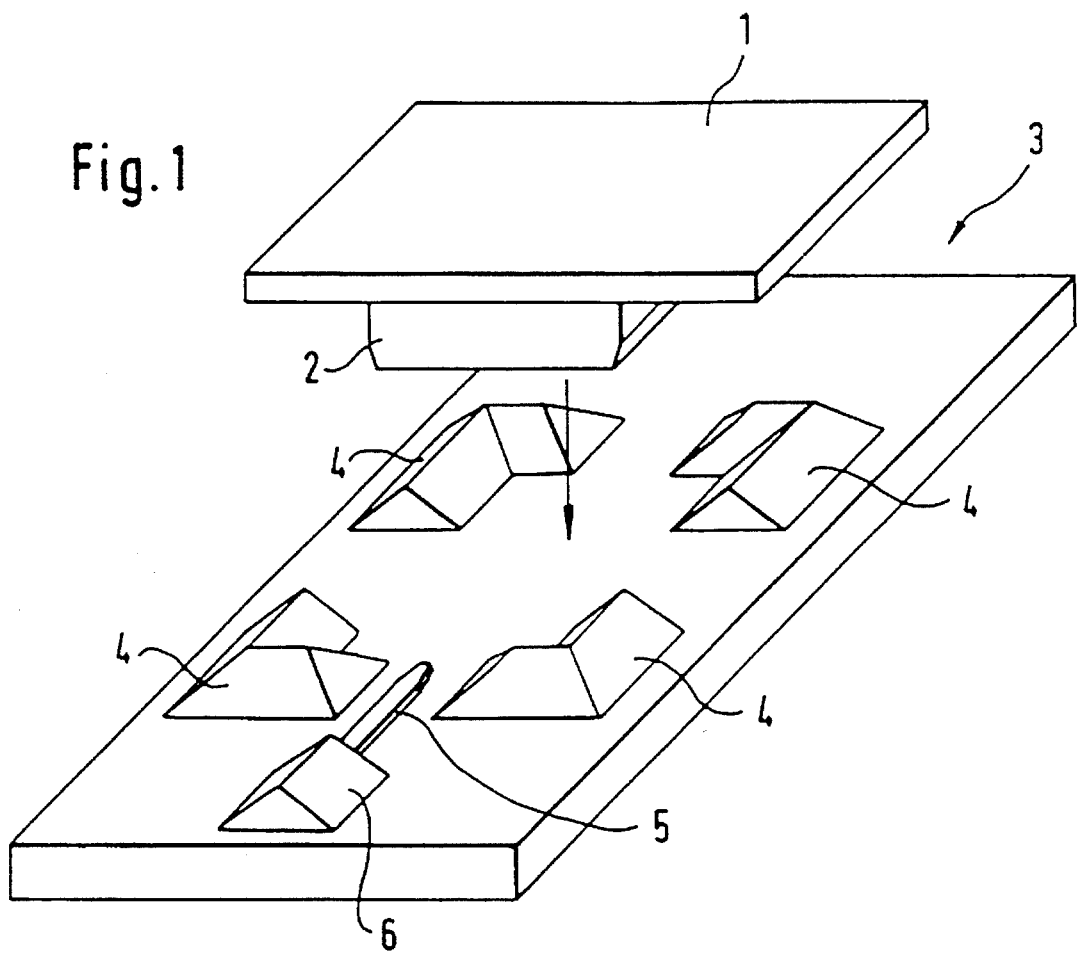
FIG. 1 shows a molding tool having an electrooptic semiconductor component in accordance with the present invention.

Represented in FIG. 1 is an electrooptic semiconductor component 2 which is applied to a carrier plate 1. FIG. 1 also shows a molding tool 3 having holding devices 4, a negative mold 5 for a waveguide trench 9 and a further negative mold 6 for a holding device 12 for an optical waveguide 10. The molding tool 3 having the holding devices 4 and the negative molds 5, 6 preferably consists of a metal that can be molded galvanically, such as nickel, for example. The holding devices 4 and the negative mold 5 of the waveguide trench 9 and the negative mold 6 for the holding device 12 are aligned with respect to one another such that upon insertion of the electrooptic semiconductor component 2 into the holding devices 4 the exit region of the light generated by the electrooptic semiconductor component 2 is coupled in an optimally adjusted fashion to the waveguide trench 9 molded by the negative mold 5.

It is particularly important to prevent a lateral offset of the negative mold 5 with respect to the exit region of the light beam. Consequently, the holding devices 4 must fix the position of the electrooptic semiconductor component 2 with the highest accuracy in the transverse direction relative to the negative mold 5.

For this purpose, the electrooptic semiconductor component 2 must have a defined width of low tolerance. The accuracy of the adjustment is increased by providing that those side walls of the holding devices 4 of the molding tool 3 which extend parallel to the negative mold 5, and the side walls of the electrooptic semiconductor component 2 extend inwards at least partially slightly obliquely, with the result that the distance to the holder of the electrooptic semiconductor component 2 decreases between the sides of the holding devices 4 with decreasing distance from the molding tool 3.

FIGS. 2A–2C shows the basic unit 13, which consists of an electrooptic semiconductor component 2 which is embedded in a molded material 14. The molding tool 3 has molded in the molded material 14 a waveguide trench 9, recesses 17 and a holding device 12 for an optical waveguide 10, which device is self-adjusting with respect to the waveguide trench 9. The recesses 17 have been embossed into the material 14 by the holding devices 4 of the molding tool 3, which are used to hold and adjust the inserted electrooptic semiconductor component 2 with respect to the waveguide trench 9. The cross section A—A' through the basic unit 13 shown in FIG. 2C, clearly shows the structure of the recesses 17 and the beveling of the lateral faces of the electrooptic semiconductor component 2. The recesses 17 are arranged about the electrooptic semiconductor component 2 in such a way that the alignment of the electrooptic semiconductor component 2 with the waveguide trench 9 is fixed. The waveguide trench 9 adjoins the light-emitting region of the electrooptic semiconductor component 2. The holding device 12 for the optical waveguide 10 adjoins the waveguide trench 9. This holding device 12 is preferably configured as a V trench. As a result of this shaping, a simple and precise adjustment of the optical waveguide 10 is achieved with respect to the waveguide trench 9.

Also represented in FIG. 2B is a cover 7 which has preferably been molded from the same material as the basic unit 13. The cover 7 has a contact opening 8 for electrically contacting the electrooptic semiconductor component 2, and a holding device 18 for the optical waveguide 10. The holding device 18 of the cover 7 is constructed for the purpose of holding the optical waveguide 10 as a V trench in this selected example.

Figure 3:
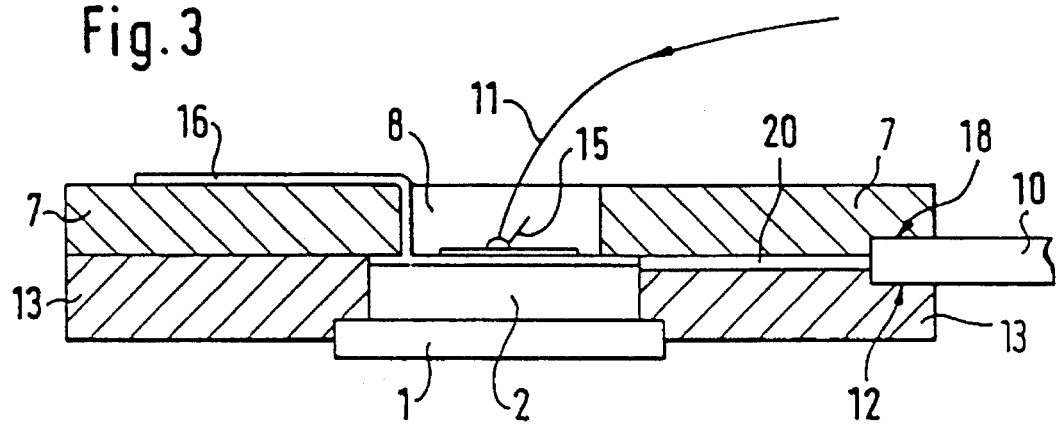
FIG. 3 shows a section through an integrated optical circuit in accordance with the present invention.

FIG. 3 shows a section through an integrated optical circuit, consisting of a basic unit 13 which is permanently connected to a cover 7. Furthermore, an optical waveguide 10 is coupled to the waveguide 20. A contact wire 11 is attached to the electrooptic semiconductor component 2 via the contact opening 8. In addition, the electrooptic semiconductor component 2 can be contacted by means of sputtered-on conductor tracks 16 as represented in FIG. 3. The waveguide trench 9 is filled with an optically transparent material having a higher refractive index than the refractive index of the material 14, preferably with a polymer, and thus forms the waveguide 20. The exit region of the light of the electrooptic semiconductor component 2 is coupled to the waveguide 20. The optical waveguide 10 is permanently connected to the integrated optical circuit via the holding devices 12 of the basic unit 13 and the holding device 18 of the cover 7, and coupled to the waveguide 20.

Figure 4A:
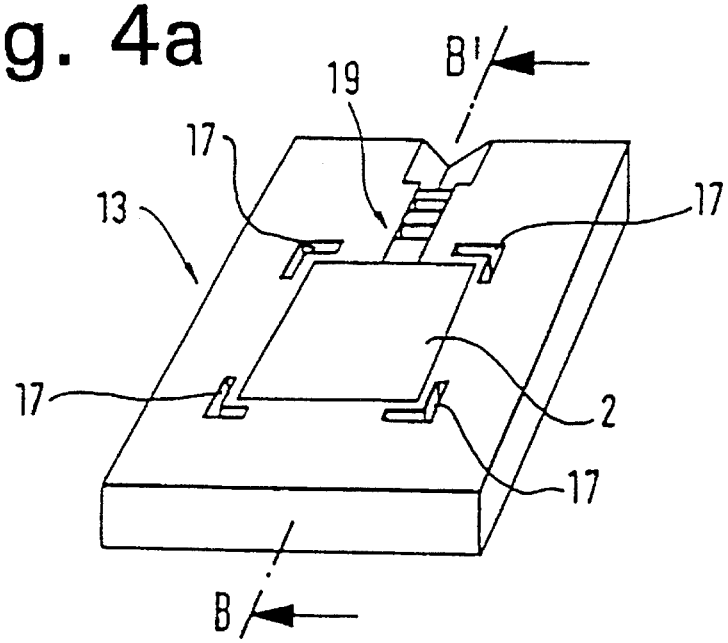
FIG. 4A shows a basic unit having a segmented taper in accordance with the present invention.
Figure 4B:
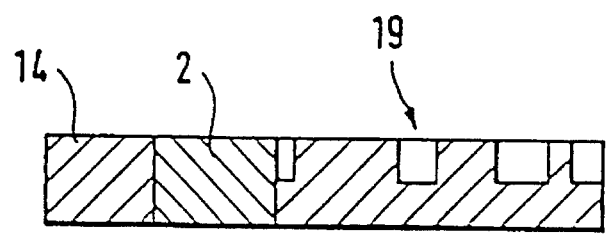
FIG. 4B shows a cross section through a basic unit having a segmented taper in accordance with the present invention.

FIGS. 4A–4B shows a basic unit 13 having a waveguide trench 9 which is constructed as a segmented taper. The cross section B—B', illustrated in FIG. 4B, shows the structure of the segmented taper. Represented in this example is a two-dimensional taper, such as described in Z. Weissmann, "2-D Mode Tapering Via Tapered Channel Waveguide Segmentation", Electronics Letters, Vol. 28, No. 16, 1992, pages 1514 ff. The segmented taper 19 expands the diameter of the light beam emitted by the electrooptical semiconductor component 2. As a result, when the light beam is coupled into the optical waveguide 10, the coupling losses are reduced owing to the better matching of the spot diameter. The waveguide trench 9 can preferably also be constructed as a three-dimensional taper.

Figure 5:
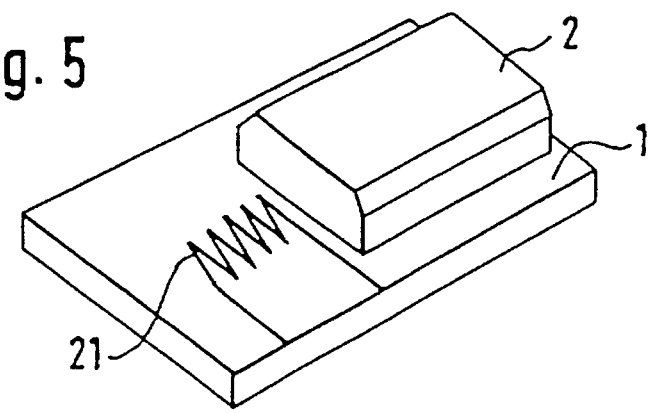
FIG. 5 shows an integrated optical circuit having a thermoelectric component in accordance with the present invention.

FIG. 5 shows a carrier plate 1 which apart from an electrooptic semiconductor component 2 carries a thermoelectric component 21. The thermoelectric component 21 is embedded in a basic unit 13 in the same way as the electrooptic semiconductor component 2. The refractive index of one or more waveguides 20, which extend in the vicinity of the thermoelectric component 21, can be varied with the aid of the thermoelectric component 21.

The method according to the present invention is explained in more detail with the aid of FIGS. 1 to 5. In order to produce the basic unit 13, the electrooptic semiconductor component 2, which is mounted on a carrier plate 1, is inserted into the holding devices 4 of the molding tool 3. In this case, the electrooptic semiconductor component 2 is adjusted with respect to the negative mold 5 of the waveguide trench 9 by the shape and alignment of the holding devices 4, with the result that lateral offsets and instances of tilting are prevented. Thereafter, the molding tool 3 and the inserted electrooptic semiconductor component 2 with the carrier plate 1 are encapsulated by a moldable material. The material used is preferably a polymer. The use of the molding tool 3 with the negative molds 5, 6 for a waveguide trench 9 and holding devices 12 for the optical waveguide 10 enable simple molding by means of injection-molding, injection-compression-molding or casting processes, it being preferable to use polymer plastics.

The holding devices 4 of the molding tool 3 can preferably be constructed in such a way that laser diodes, laser diode arrays, laser diode amplifiers, laser diode amplifier arrays, semiconductor modulators, semiconductor demodulator arrays, detectors and detector arrays are optically coupled in a self-adjusting fashion with respect to the waveguide 20.

This method permits a hybrid installation of electrooptic semiconductor components 2 in polymer, integrated optical circuits by the use of a self-adjusting method. After removal of the molding tool 3, a basic unit 13 is present which consists of an electrooptic semiconductor component 2 and a molded material 14. In this selected example, a waveguide trench 9 and a holding device 12 have been inserted into the polymer plastic by molding of the molding tool 3. As represented in FIG. 3, in this exemplary embodiment, an optical fiber or an optical fiber bundle is coupled as optical waveguide 10 to the waveguide 20.

In order to cover the electrooptic semiconductor component 2 and the waveguide trench 9, use is made of a cover 7 which can be produced, for example, from a polymer plastic with the aid of a molding tool. The cover 7 selected for this example has a contact opening 8 which is used for the electrical contacting of the electrooptic semiconductor component 2, and a holding device 18 which is used to adjust and mount the optical waveguide 10. The optical waveguide 10 is inserted into the holding device 12 of the basic unit 13 for the purpose of producing the integrated optical circuit. An optically transparent adhesive, preferably a polymer plastic, is applied to the basic unit 13, while the waveguide trench 9 and the recesses 17 are filled. The filling of the waveguide trench 9 with an optically transparent material having a refractive index higher than that of the material 14 produces a waveguide 20 from the waveguide trench 9. The cover 7 is laid onto the basic unit 13, with the result that the optical waveguide 10 is coupled in a self-adjusting fashion to the waveguide 20 from the holding device 18 of the cover 7 and the holding device 12 of the basic unit 13. The cover 7 is pressed against the basic unit 13, with the result that only a thin layer of the polymer plastic is located outside the waveguide trench 9 between the basic unit 13 and the cover 7, which layer produces the connection between the basic unit 13 and the cover 7 after curing of the polymer plastic.

As represented in FIG. 3, a contact wire 11 is bonded via the contact opening 8 to the electrooptic semiconductor component 2 for the purpose of electrical contacting. Given the use of a cover which has no contact opening 8, the opening required for electrical contacting can be inserted subsequently into the cover 7 by means of laser ablation. Preferably, a conductor track 16 can be sputtered on or vapor deposited for the purpose of electrically contacting the electrooptic semiconductor component 2. The production of the molding tool 3 in various shapes makes it possible not only for a specific electrooptic semiconductor component 2, but for various electrooptic semiconductor components such as, for example, laser diodes, laser diode arrays, laser diode amplifiers, laser diode amplifier arrays, semiconductor modulators, semiconductor demodulator arrays or detectors and detector arrays, to be reshaped simultaneously with a polymer plastic and embedded in a basic unit. Moreover, the molding of the waveguide trench 9 offers the possibility, as represented in FIG. 4, of constructing a segmented taper 19 in a simple way in one method step including the production of the basic unit 13.

The production of the segmented taper 19 is performed by filling the empty spaces, which remain in the waveguide trench 9 after the molding of the basic unit with a polymer. The polymer, which is used to fill the empty spaces, has a higher refractive index in comparison to the polymer plastic from which the basic unit 13 was molded.

Since it is impermissible for the active zone of the electrooptic semiconductor component 2, which produces the laser light as in the case of a laser diode, to be damaged during insertion of the electrooptic semiconductor component 2, it is advantageous to attach to the molding tool 3 spacers which prevent damage to the active zone. The carrier plate 1 serves as a heat sink, and can preferably be coupled to a Peltier element.

Furthermore, a silicon plate having electronic circuit arrangements can be used as the carrier plate 1. The conductor tracks 16 vapor deposited or sputtered onto the cover 7 are to be applied at an appropriate thickness, so that the current intensities required to operate the electrooptic semiconductor component 2 can be supplied without heating the conductor tracks 16.

What is claimed is:

1. A method for producing a hybrid integrated optical circuit having at least one electrooptic semiconductor component, comprising the steps of:

attaching the at least one electrooptic semiconductor component to a carrier plate;

inserting the at least one electrooptic semiconductor component into a molding tool, the molding tool including a plurality of first holding devices for holding the at least one electrooptic semiconductor component and a first negative mold for forming at least one waveguide trench;

encapsulating the molding tool and the at least one electrooptic semiconductor component with a moldable material; and removing the molding tool, thereby producing a basic unit including the encapsulated at least one electrooptic semiconductor component and a molded material, the basic unit further including the at least one waveguide trench formed by the first negative mold, the at least one waveguide trench being aligned with respect to the at least one electrooptic semiconductor component for coupling a light generated by the at least one electrooptic semiconductor component to at least one optical waveguide.

2. The method set forth in claim 1, wherein the molding tool further includes a second negative mold for forming at least one second holding device for holding the at least one optical waveguide.

3. The method set forth in claim 2, wherein the at least one second holding device is aligned with respect to one of the at least one electrooptic semiconductor component and the at least one waveguide trench for optimally coupling the light generated by the at least one electrooptic semiconductor component to the at least one optical waveguide.

4. The method set forth in claim 1, wherein the at least one optical waveguide includes one of an optical fiber and an optical fiber bundle.

5. The method set forth in claim 1, wherein each of the plurality of the first holding devices include side walls being at least partially inclined inward, and wherein the at least one electrooptic semiconductor component includes side walls being at least partially inclined inward, each of the first holding device side walls thereby delimiting a space for inserting the at least one electrooptic semiconductor component and cooperatively engaging a respective one of the electrooptic semiconductor component side walls.

6. The method set forth in claim 1, further comprising the step of filling the at least one waveguide trench with an optically transparent material, thereby forming a waveguide.

7. The method set forth in claim 1, further comprising the step of connecting the basic unit to the at least one optical waveguide via a cover having at least one third holding device which is aligned with respect to one of the at least one electrooptic semiconductor component and the at least one waveguide trench for optimally coupling the light generated by the at least one electrooptic semiconductor component to the at least one optical waveguide.

8. The method set forth in claim 6, wherein the waveguide trench is filled with a polymer.

9. The method set forth in claim 7, wherein the cover is composed of a polymer.

10. The method set forth in claim 7, wherein the cover includes an opening for facilitating an electrical connection with the at least one electrooptic semiconductor component.

11. The method set forth in claim 7, further comprising the step of forming an opening in the cover via laser ablation for facilitating an electrical connection with the at least one electrooptic semiconductor component.

12. The method set forth in claim 1, further comprising the step of forming an electrical contact with the at least one electrooptic semiconductor component.

13. The method set forth in claim 12, wherein the electrical contact includes sputtered-on conductor tracks.

14. The method set forth in claim 12, wherein the electrical contact includes vapor deposited conductor tracks.

15. The method set forth in claim 12, wherein the electrical contact includes conducting wires attached to the at least one electrooptic semiconductor component.

16. The method set forth in claim 1, wherein the at least one electrooptic semiconductor component includes one of a laser diode, a laser diode array, a laser diode amplifier, a laser diode amplifier array, a semiconductor modulator, a semiconductor demodulator array, a detector and a detector array.

17. The method set forth in claim 1, wherein the at least one waveguide trench is filled with an optically transparent material having a refractive index, further comprising the step of attaching a thermoelectric component to the basic unit for varying the refractive index of the optically transparent material.

18. The method set forth in claim 17, wherein the thermoelectric component includes a thermal probe.

19. The method set forth in claim 1, wherein the at least one waveguide trench forms a continuous lateral taper.

20. The method set forth in claim 1, wherein the at least one waveguide trench forms a segmented taper.

21. The method set forth in claim 1, further comprising the step of coupling a heat sink to the carrier plate.

22. The method set forth in claim 21, wherein the heat sink includes a Peltier element.

23. The method set forth in claim 1, wherein the carrier plate includes a silicon plate having at least one electronic circuit.

\* \* \* \* \*